(12) United States Patent
Liu et al.

(10) Patent No.: US 8,173,518 B2
(45) Date of Patent: May 8, 2012

(54) METHOD OF WAFER BONDING (75) Inventors: Martin Liu, Yonghe (TW); Alex Hsu, Hsinchu (TW); Chung-Yi Yu, Hsin-Chu (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 149 days.

(21) Appl. No.: 12/414,910

(22) Filed: Mar. 31, 2009

(65) Prior Publication Data
US 2010/0248414 A1 Sep. 30, 2010

(51) Int. Cl.
*H01L 21/30* (2006.01)

(52) U.S. Cl. ............... 438/455; 438/459; 257/E21.237; 257/E21.567

(58) Field of Classification Search ................ 438/70, 438/458–459, 690
See application file for complete search history.

(56) References Cited

U.S. PATENT DOCUMENTS

| | | | | |
|---|---|---|---|---|
| 5,668,045 | A * | 9/1997 | Golland et al. | 438/459 |
| 6,113,721 | A * | 9/2000 | Secco d'Aragona et al. | 156/154 |
| 7,129,172 | B2 | 10/2006 | Morrow et al. | |
| 7,256,105 | B2 | 8/2007 | Yamaguchi | |
| 2008/0014721 | A1* | 1/2008 | Bauer | 438/478 |
| 2008/0044984 | A1* | 2/2008 | Hsieh et al. | 438/459 |
| 2008/0061330 | A1* | 3/2008 | Shiau et al. | 257/294 |
| 2009/0079000 | A1* | 3/2009 | Yamazaki et al. | 257/351 |
| 2010/0300611 | A1* | 12/2010 | Yamamoto et al. | 156/248 |

* cited by examiner

*Primary Examiner* — Fernando L Toledo
*Assistant Examiner* — Mark A Laurenzi
(74) *Attorney, Agent, or Firm* — Haynes and Boone, LLP (57) ABSTRACT

Provided is a method of fabricating a semiconductor device. The method includes providing a device substrate having a front side, a back side, and a first edge portion, forming a material layer over a portion of the front side of the device substrate, trimming the first edge portion, removing the material layer, bonding the front side of the device substrate to a carrier substrate, thinning the device substrate from the back side, and trimming a second edge portion of the thinned device substrate.

20 Claims, 8 Drawing Sheets

METHOD OF WAFER BONDING

BACKGROUND

In semiconductor technologies, image sensors are used for sensing a volume of exposed light projected towards a semiconductor substrate. Complementary metal-oxide-semiconductor (CMOS) image sensors (CIS) and charge-coupled device (CCD) sensors are widely used in various applications such as digital still camera applications. These devices utilize an array of pixels or image sensor elements, including photodiodes and transistors, to collect photo energy to convert images into electrical signals. To enhance the photo-sensing efficiency of the pixels, a back-side illumination (BSI) technique may be used to fabricate the image sensors. The BSI technique utilizes a technique known as wafer bonding, which involves thinning a device wafer and bonding it to a carrier wafer. The wafer bonding technique has also been used to produce other types of semiconductor devices such as three-dimensional structure integrated circuits (ICs). However, current methods of wafer bonding may cause damage to the device wafer or the carrier wafer, or otherwise contaminate the wafers with undesired particles that would make the thinning or bonding processes less effective.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

One of the broader forms of the present disclosure involves a method of fabricating a semiconductor device that includes: providing a device substrate having a front side, a back side, and a first edge portion; forming a material layer over a portion of the front side of the device substrate; trimming the first edge portion; removing the material layer; bonding the front side of the device substrate to a carrier substrate; thinning the device substrate from the back side; and trimming a second edge portion of the device substrate.

Another of the broader forms of the present disclosure involves a method of fabricating a semiconductor device that includes: providing a device substrate having a front surface, a back surface, and an edge portion; forming a material layer to substantially cover the front surface; trimming the edge portion including the material layer overlying the edge portion; removing the material layer; and bonding the front surface of the device substrate to a carrier substrate.

Still another of the broader forms of the present disclosure involves a method of fabricating a semiconductor device that includes: providing a device substrate having a front side and a back side; bonding the front side of the device substrate to a carrier substrate; thinning the device substrate from the back side; and trimming an edge portion of the thinned device substrate.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
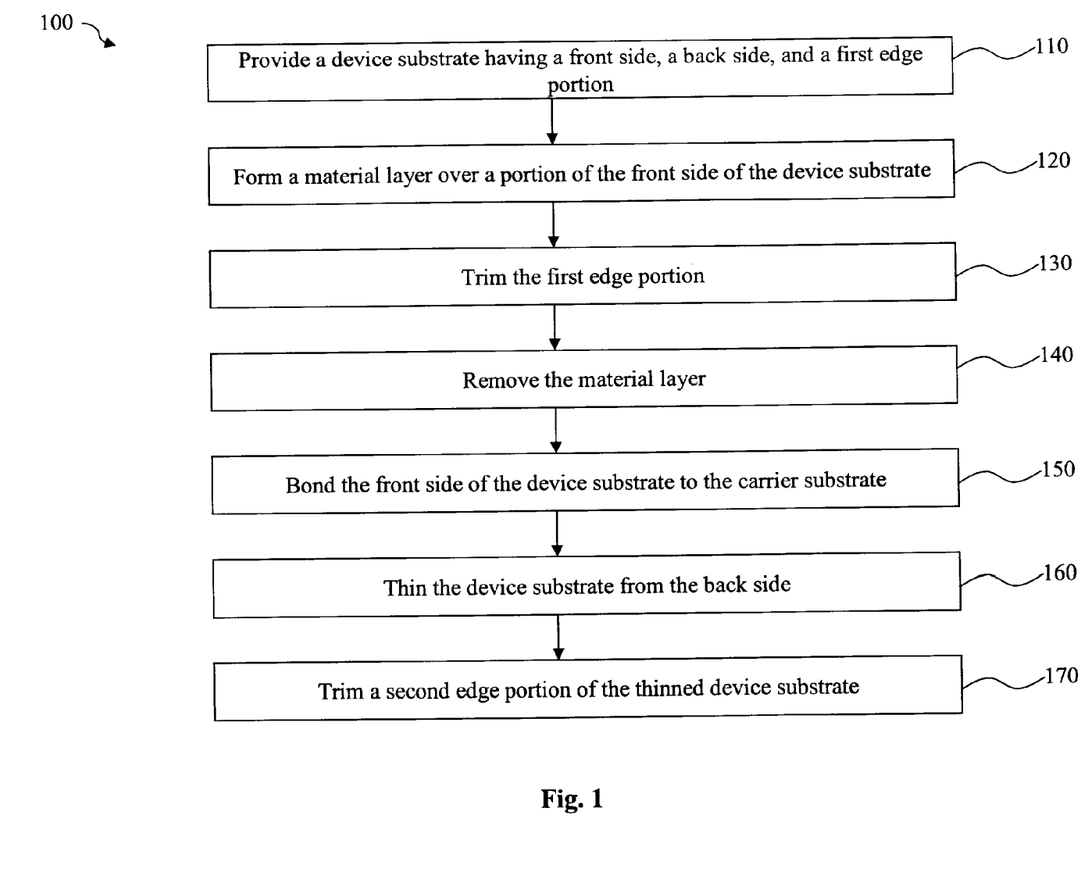
FIG. 1 is a flowchart illustrating a method for fabricating a semiconductor device according to various aspects of the present disclosure.

Illustrated in FIG. 1 is a flowchart of a method 100 for a method of wafer bonding according to various aspects of the present disclosure. FIGS. 2A to 2G are cross-sectional views of one embodiment of a semiconductor device 200 at various stages of fabrication according to the method 100 of FIG. 1. For the sake of example, the semiconductor device 200 shown in FIGS. 2A to 2G is a back-side illuminated (BSI) image sensor device. The BSI image sensor device 200 includes an array or grid of pixels for sensing and recording an intensity of light radiation directed towards a back-side of the image sensor device 200. The image sensor device 200 may include a charge-coupled device (CDD), complimentary metal oxide semiconductor (CMOS) image sensor (CIS), an active-pixel sensor (APS), a micro electrical mechanical systems (MEMS) device, or a passive-pixel sensor. The image sensor device 200 may further include additional circuitry and input/outputs that are provided adjacent to the grid of pixels for providing an operation environment for the pixels and for supporting external communication with the pixels. It is understood that FIGS. 2A-2G have been simplified for a better understanding of the inventive concepts of the present disclosure.

Referring to FIG. 1, the method 100 begins with block 110 in which a device substrate having a front side, a back side, and a first edge is provided. The method 100 continues with block 120 in which a material layer is formed over a portion of the front side of the device substrate. The method 100 continues with block 130 in which the first edge portion is trimmed. The method 100 continues with block 140 in which the material layer is removed. The method 100 continues with block 150 in which the front side of the device substrate is bonded to the carrier substrate. The method 100 continues with block 160 in which the device substrate is thinned from the back side. The method 100 continues with block 170 in which a second edge portion of the thinned substrate is trimmed.

Figure 2A:
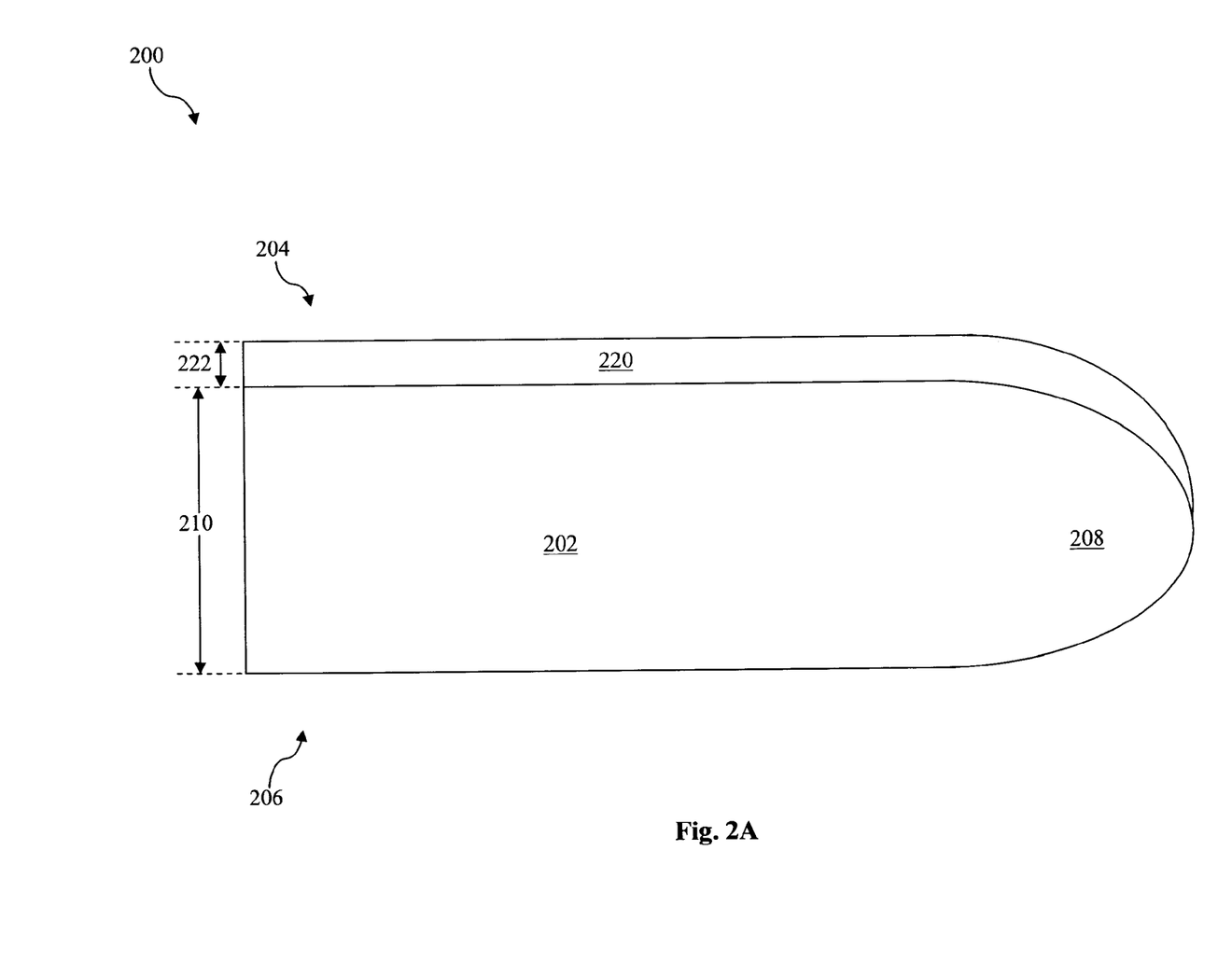
FIGS. 2A-2G are cross-sectional views of a semiconductor device at various stages of fabrication according to the method of FIG. 1.

Referring to FIG. 2A, illustrated is a semiconductor device 200 that includes a substrate 202 having a front side (or front surface) 204 and a back side (or back surface) 206. In the present embodiment, the substrate 202 is a silicon substrate doped with either a P-type dopant such as boron (e.g., P-type substrate) or an N-type dopant such as phosphorous (e.g., N-type substrate). In other embodiments, the substrate 202 includes other elementary semiconductors such as germanium and diamond. Alternatively, the substrate 202 may optionally include a compound semiconductor and/or an alloy semiconductor. Further, the substrate 202 may include an epitaxial layer (epi layer), may be strained for performance enhancement, and may include a silicon-on-insulator (SOI) structure. The substrate 202 may also include semiconductor circuits. In the present embodiment, the substrate 202 includes a plurality of pixels having light sensing regions. The light sensing regions are operable to detect radiation, such as light, projected towards the back side 206 of the substrate 202. The images associated with the radiation are converted into electrical signals by the light sensing regions. The pixels in the substrate 202 may also have isolation structures to isolate the pixels from each other to reduce interference between the pixels such as cross-talk noise. Since the substrate 202 includes semiconductor devices such as pixels, it may also be referred to as a device substrate 202. The device substrate 202 has an initial thickness 210 that ranges from 100 um to 3000 um. In the present embodiment, the initial thickness 210 is about 1472 um.

A material layer 220 is then formed on the front side 204 of the device substrate 202. In the present embodiment, the material layer 220 covers substantially the entire front surface 204 of the device substrate 202, including the edge portion 208. In alternative embodiments, the material layer 220 covers only selected regions of the front surface 204. Also in the present embodiment, the material layer 220 includes a photoresist material and is formed by a spin-coating process. The material layer 220 has a thickness 222 ranging from about 10 um to about 2250 um in the present embodiment. In other embodiments, the material layer 220 includes a tape such as ultra-violet (UV) tape (tape removable by exposure to UV light) or non-UV tape (tape not removable by exposure to UV light), chemical vapor deposition (CVD) film, physical vapor deposition (PVD) film, an Advanced Patterning Film (APF) made by Applied Materials, Inc., that is commercially available, wax, reusable template film or carrier, or glass. In accordance with the specific material in the material layer 220 in the alternative embodiments, the material layer 220 may be formed on the front surface 204 of the device substrate through various deposition, printing, spray coating, or electroplating processes known in the art.

Figure 2B:
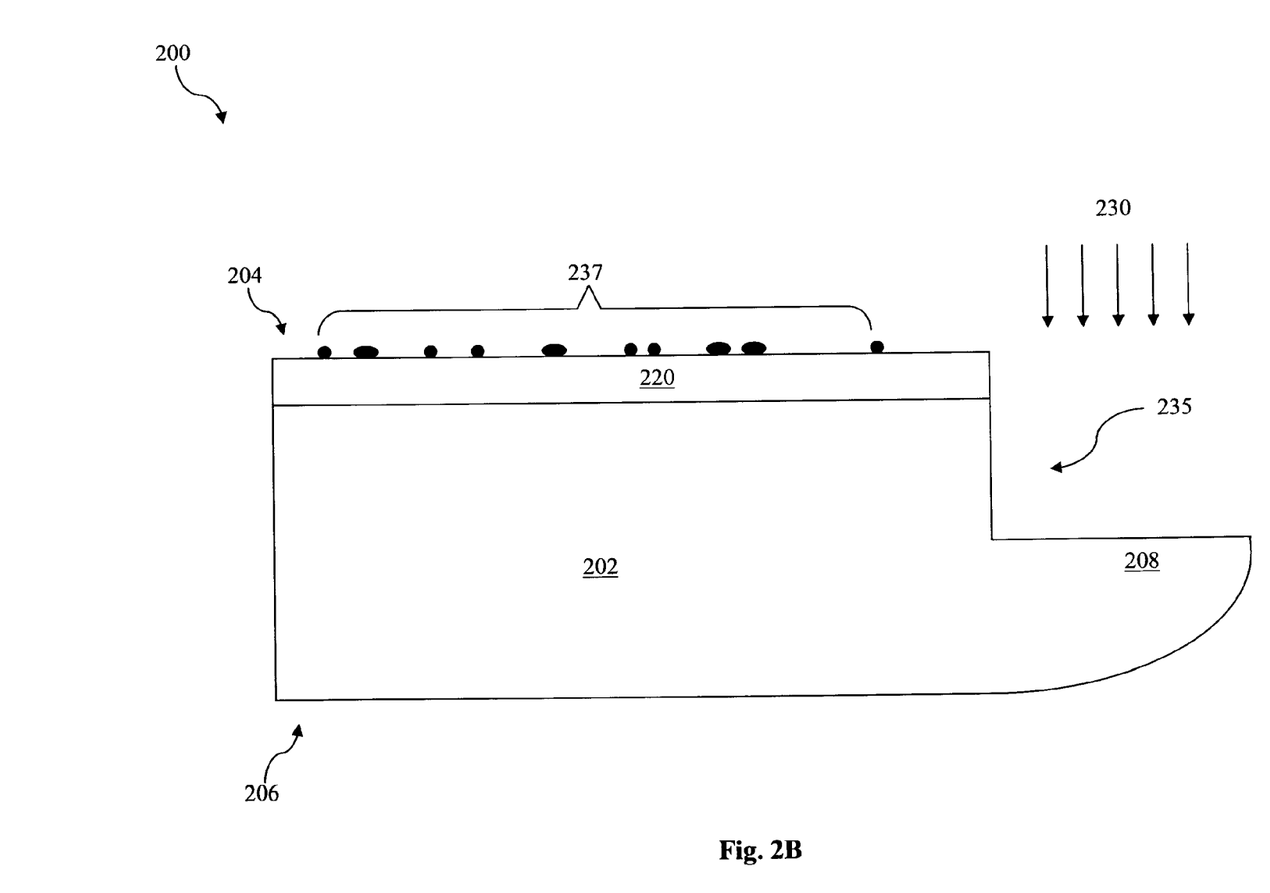

Referring now to FIG. 2B, the edge portion 208 is trimmed through a trimming process 230. In the present embodiment, the trimming process 230 includes a mechanical process that uses a dicing blade to trim away a portion of the edge portion 208. The dicing blade may trim the edge portion 208 in a vertical direction, a horizontal direction, or at an angle. In an alternative embodiment, the trimming process 230 utilizes an energy beam, such as a laser beam or a focused ion beam, to trim the edge portion 208. In yet another embodiment, the trimming process 230 uses selective etching to trim the edge portion 208. In one more embodiment, the trimming process 230 includes removing a bulk of the edge portion 208 by a taping and de-taping process (which may include exposure to UV light) and smoothing the surface of the remaining portion of the device substrate 202 by a polishing process. As shown in FIG. 2B, only a portion of the edge portion 208 is removed by the trimming process 230 in the present embodiment. In other embodiments, the entire edge portion 208 is removed by the trimming process 230. In both the present embodiment and alternative embodiments described, the trimming process 230 may remove a portion of the material 220 overlying the edge portion 208 along with trimming the edge portion 208.

One of the reasons for trimming the edge portion 208 is to avoid a defect known as "edge chipping." Edge chipping may occur when the device substrate 202 is bonded to a carrier substrate in a bonding process that will be discussed later. In the bonding process, the device substrate 202 is thinned by a grinding process. Although majority of the device substrate 202 is supported by the carrier substrate during the grinding, the bevel-shaped edge portion 208 is not supported. Thus, when pressure is applied to the edge portion 208 when the device substrate 202 is grinded, the edge portion 208 may chip due to the lack of strength and support. Edge chipping may result in relatively large areas of the device substrate 202 becoming delaminated (physical separation between the device substrate 202 and the carrier substrate), which may lead to subsequent processing inefficiencies or cause yield problems. In the present embodiment, the edge portion 208 is trimmed so that even if edge chipping occurs during bonding, the chipped region will be removed during the thinning process. The remaining portions of the device substrate 202 are unaffected. Hence, one of the advantages of the present embodiment is that the device substrate 202 is not negatively affected by potential edge chipping defects that may occur during a bonding process. Note that after a portion (or substantially all) of the edge portion 208 of the device substrate is removed in the trimming process 230, the device substrate 202 is now left with a new edge portion 235. The edge portion 235 may be trimmed in another trimming process discussed later. Also note that the trimming process 230 generates a plurality of contaminant particles 237 that are subsequently deposited over an exposed surface of the material layer 220. These particles 237 may include silicon dust, metal film, oxide, tungsten, etc.

Figure 2C:
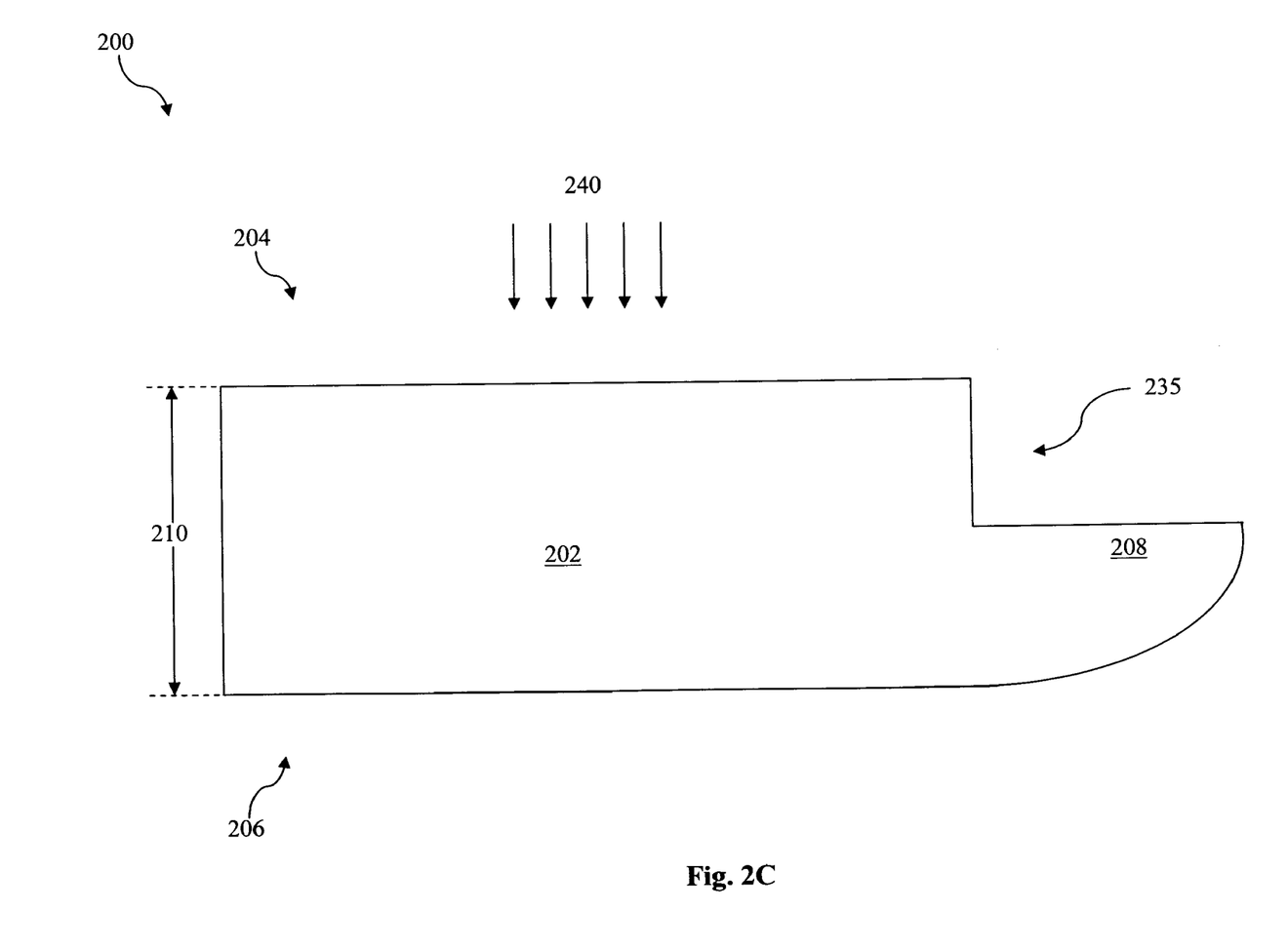

Referring now to FIG. 2C, the material layer 220 is removed in a removal process 240. Since the material layer 220 includes photoresist in the present embodiment, the removal process 240 in the present embodiment uses a photoresist stripping process to strip away the photoresist material. In other embodiments, the removal process 240 may treat the material layer 220 with processes including washing away the material layer 220 with a solution such as water, exposing the material layer 220 to an ultraviolet light, taping and de-taping the material layer 220, or just a simple application of a mechanical force to remove the material layer 220. Note that the contaminant particles 237 deposited over the material layer 220 are also removed in the removal process 240. Thus, the present embodiment offers another advantage by the formation of the material layer 220 over the device substrate 202. In situations where no material layer is formed over the device substrate, the contaminant particles generated by the trimming process would be deposited directly over the front surface 204 of the device substrate 202. Since the contaminant particles 237 may include a variety of materials, it is difficult to remove all of the contaminant particles 237 with a single cleaning process. Thus, multiple cleaning processes and/or cycles may be necessary to remove the contaminant particles 237 from the front surface 204, which would result in high cost, low throughput, or yield problems. Even then, the front surface 204 may not be rid of all contaminant particles 237. Consequently, the remaining contaminant particles 237 may cause "bubble" defects in the bonding process that will take place later, which will diminish the effectiveness of the bonding process and may result in delamination as well. In the present embodiment, the contaminant particles 237 are deposited over the material layer 220 and removed along with the material layer 220 during the removal process 240. As such, the contaminant particles 237 will not cause any bonding problems later.

Although not shown in FIG. 2C for the sake of simplicity, an interconnect structure is formed on the front side 204 of the substrate 202 prior to thinning the device substrate 202. The interconnect structure includes a plurality of patterned dielectric layers and conductive layers that provide interconnections (e.g., wiring) between the various doped features, circuitry, and input/output of the semiconductor device 200. The interconnect structure includes an inter-metal dielectric (IMD) and a multilayer interconnect (MLI) structure formed in a configuration such that the IMD separates and isolates each MLI structure from other MLI structures. The MLI structure includes contacts, vias and metal lines formed on the device substrate 202. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

Figure 2D:
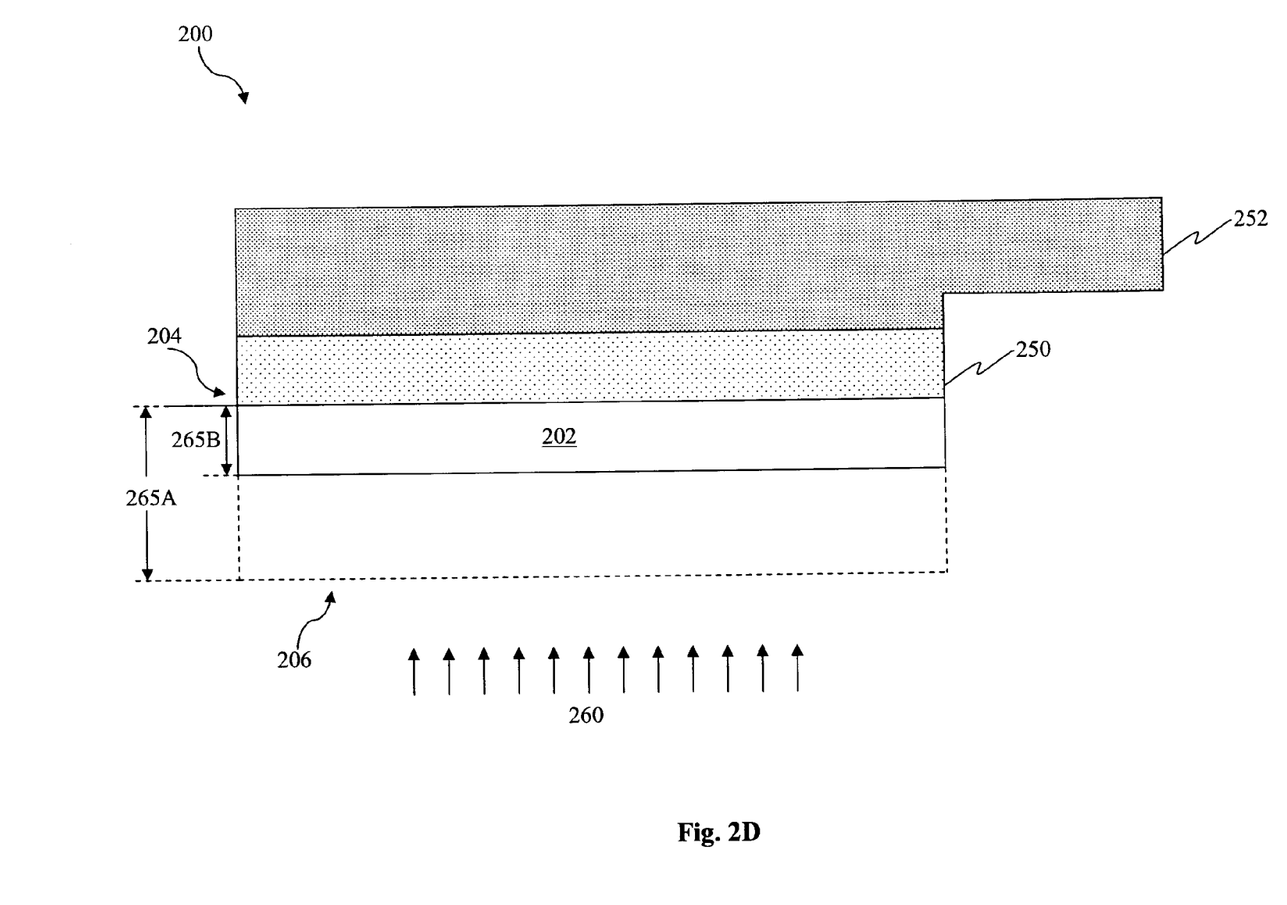

Referring now to FIG. 2D, a buffer layer 250 is formed over the device substrate 202 (or over the interconnect structure). In the present embodiment, the buffer layer 250 includes a dielectric material such as silicon oxide. Alternatively, the buffer layer 250 may optionally include silicon nitride. The buffer layer 250 is formed by CVD, PVD, or other suitable techniques. The buffer layer 250 is planarized to form a smooth surface using a process such as chemical mechanical polishing (CMP).

Next, a carrier substrate 252 is bonded with the buffer layer 250 so that processing the back side 206 of the device substrate 202 can be performed. In the present embodiment, the carrier substrate 252 is bonded to the device substrate 202 by molecular forces—a technique known as direct bonding or optical fusion bonding. This type of bonding requires extremely smooth and flat bonding surfaces, which is why the aforementioned "bubble" defects would be detrimental to effective bonding. In other embodiments, the carrier substrate 252 may be bonded to the buffer layer 250 by techniques such as metal diffusion or anodic bonding known in the art. The carrier substrate 252 may be similar to the buffer layer 270 and includes a silicon material. Alternatively, the carrier substrate 252 may optionally include a glass material. The carrier substrate 252 provides protection for the various features (such as pixels) formed in the device substrate 202, and also provides mechanical strength and support for processing the back side 206 of the substrate 202 as discussed below. It is noted that, in addition to providing a smooth and flat surface for bonding with the carrier substrate 252, the buffer layer 250 also provides electrical isolation between the device substrate 202 and the carrier substrate 252.

After bonding, the device substrate 202 and the carrier substrate 252 may be annealed to enhance the bonding strength. Afterwards, a process 260 is performed to thin the device substrate 202 from the back side 206. In the present embodiment, the process 260 includes a mechanical grinding process and a chemical thin down process. A substantial amount of substrate material may be removed from the substrate 202 during the mechanical process. After the mechanical process is performed, the substrate 202 has a reduced thickness 265A, which may range from about 25 um to about 100 um. In the present embodiment, the reduced thickness 265A is about 50 um. The chemical thin down process may include an SEZ etching process known in the art that applies an etching chemical to the back side 206 to further thin the device substrate 202 to a thickness 265B. In the present embodiment, the thickness 265B is less than about 3 um. The chemical thin down process may also reduce a thickness of the carrier substrate 252. In the present embodiment, the thickness of the carrier substrate 252 is reduced by about 50 um. It is also understood that the particular thicknesses disclosed herein are mere examples and that other thicknesses may be implemented depending on the type of application and design requirements of the semiconductor device 200.

Figure 2E:
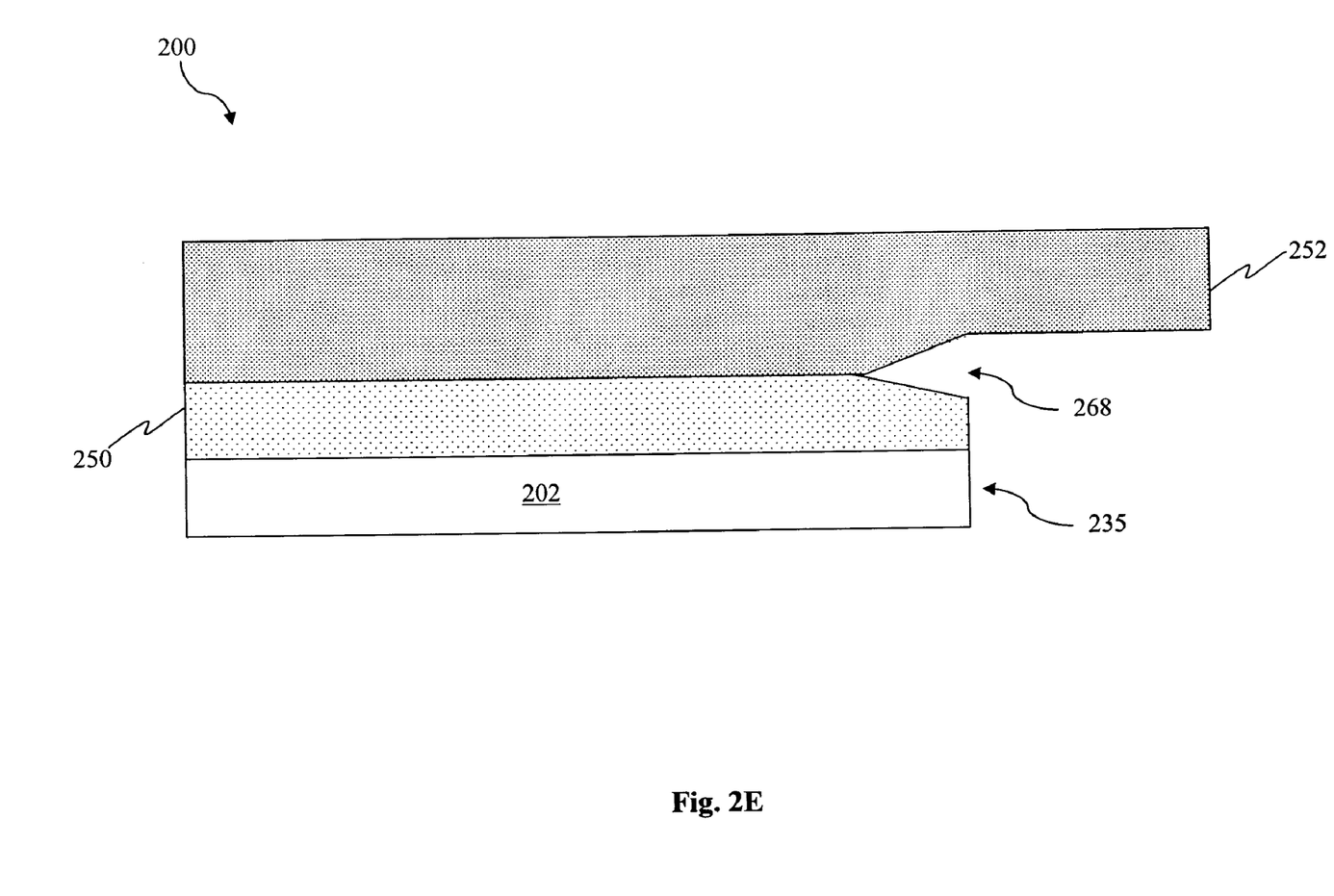

Referring now to FIG. 2E, it has been observed that the chemicals used in the chemical thin down process of the process 260 may penetrate through a bonding interface between the buffer layer 250 and the carrier substrate 252 and chip away materials in the regions nearby. For example, a wedge-shaped opening or slot 268 may form around the bonding interface between the buffer layer 250 and the carrier substrate 252. This opening 268 may result in delamination or separation between the substrates 202 and 252, particularly if the substrates 202 and 252 undergo one or more subsequent thermal processes. Thus, the edge region 235 of the device substrate 202 as well as other regions of the carrier substrate 252 and the buffer layer 250 around the opening 268 may be considered damaged and need to be removed.

Figure 2F:
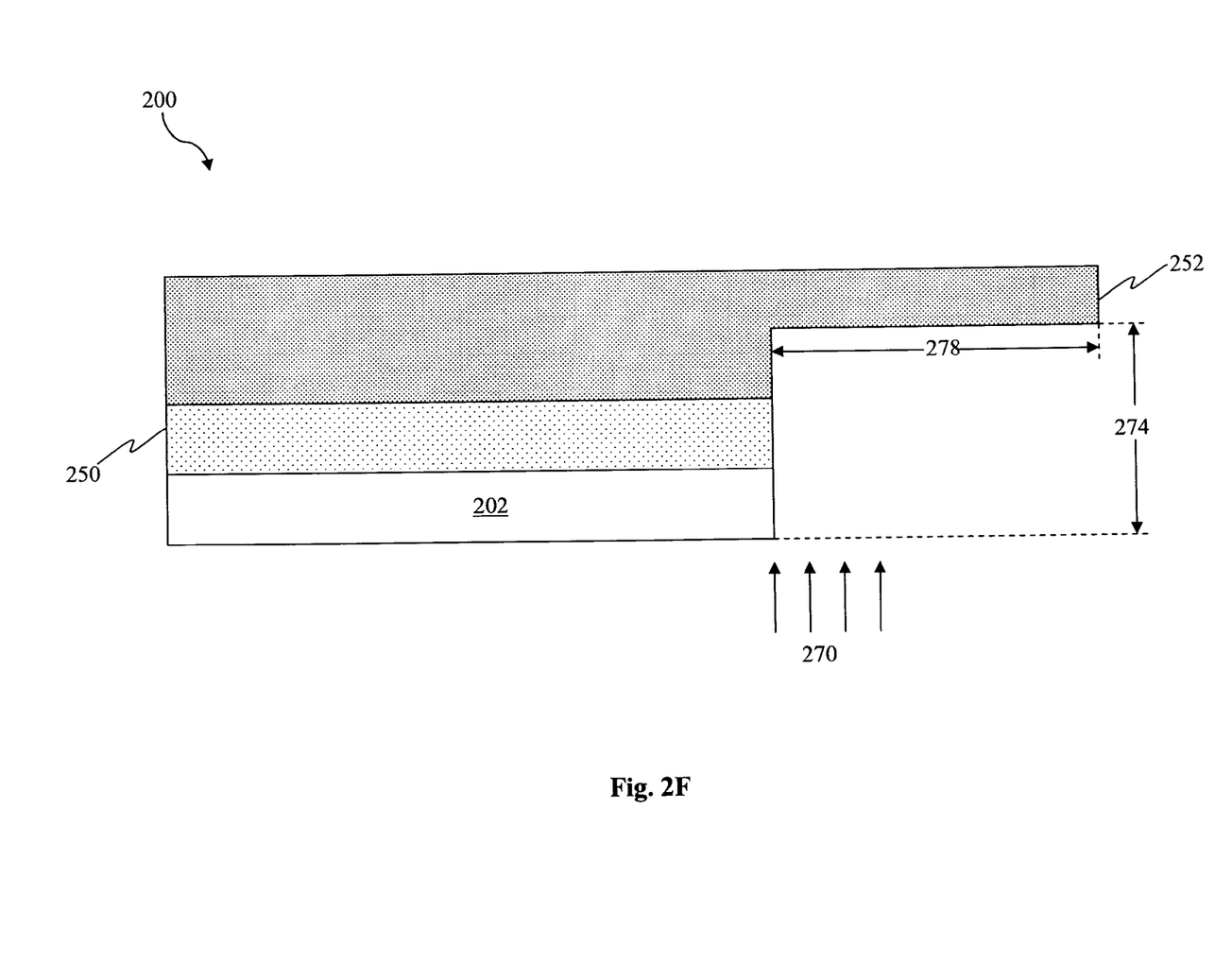

Referring now to FIG. 2F, a trimming process 270 is applied to the semiconductor device 200 to remove the edge portion 235 and other damaged regions near the opening 268. In the present embodiment, the trimming process 270 utilizes a blade to trim away materials that need to be removed. The blade may be used to trim materials in a vertical direction, a horizontal direction, or at an angle. The blade may also have a polished head so that the remaining materials may have a smooth surface after trimming. In an alternative embodiment, the trimming process 270 utilizes an energy beam, such as a laser beam or a focused ion beam, to perform the trimming. In yet another alternative embodiment, the trimming process 270 uses selective etching to perform the trimming. In one more embodiment, the trimming process 270 removes a bulk of the materials to be trimmed by a taping and de-taping process, and smoothes the surface of the remaining materials by a polishing process. Since the damaged regions are removed by the trimming process 270, and the opening 268 is no longer present, the risk of delamination between the substrates 202 and 252 is substantially reduced.

A trim depth 274 and a trim width 278 may be tuned by the trimming process 270. For example, in the present embodiment where a blade is used for trimming, the blade may cut deeper into the carrier substrate 252 to increase the trim depth 274, and several vertical cuts may be made adjacent to each other in a horizontal direction to increase the trim width 278. In an alternative embodiment where selective etching is used for trimming, an etching time may be extended to increase the trim depth 274, and an etching area may be enlarged to increase the trim width 278. In the present embodiment, the trim depth 274 ranges from about 0.1 um to 750 um, preferably around 100 um, and the trim width 278 ranges from about 0.1 um to about 6000 um, preferably around 3200 um.

Figure 2G:
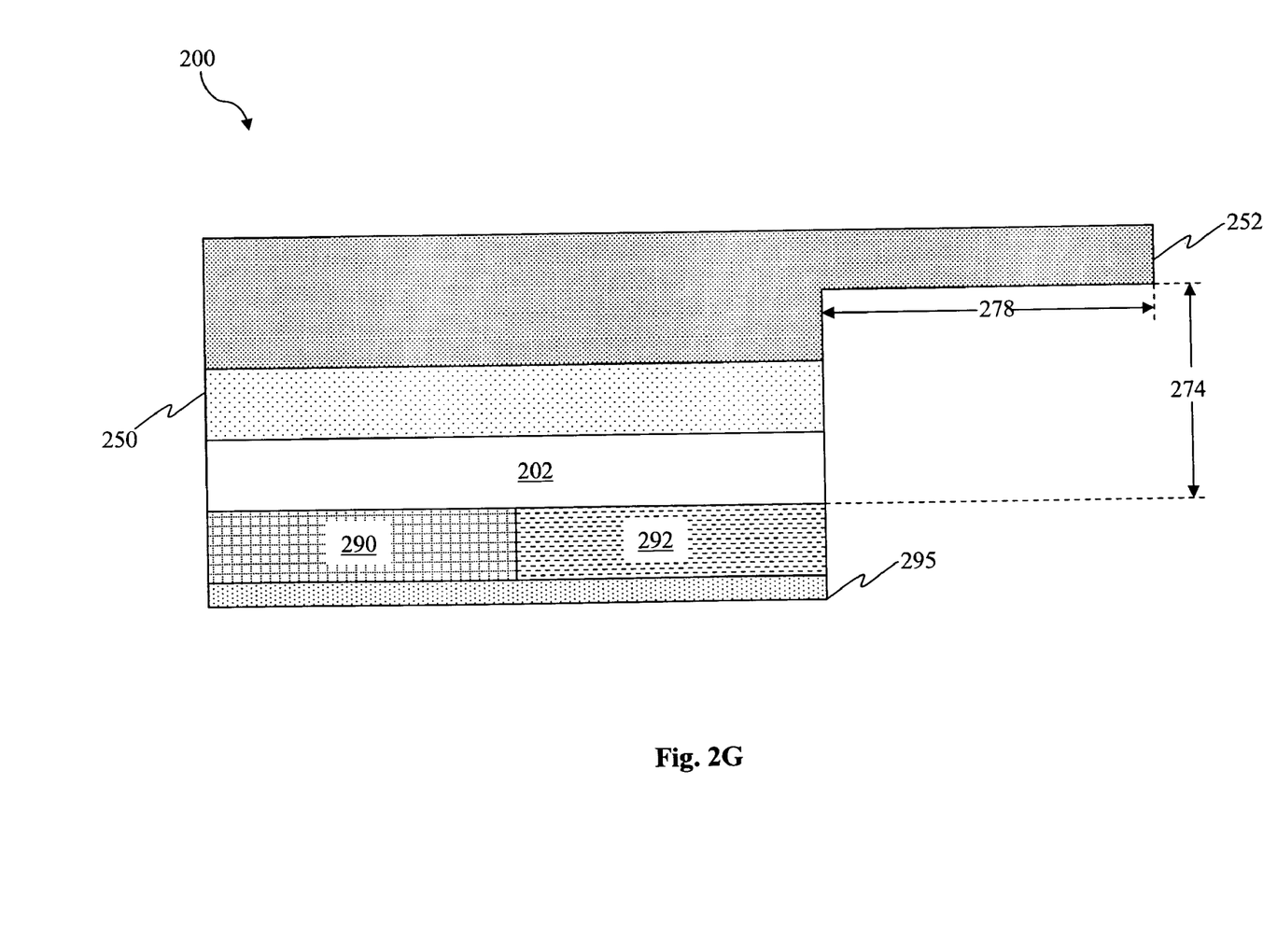

Referring to FIG. 2G, processing the back side 206 of the device substrate is performed. For example, a color filter layer is formed over the back side 206 of the device substrate 202. The color filter layer can support different color filters (e.g., red, green, and blue), and may be positioned such that the incident light radiation is directed thereon and there through. For example, the color filter layer includes a color filter 290 for filtering light radiation of a first wavelength and a color filter 292 for filtering light radiation of a second wavelength, so that light having different colors corresponding to the first and second wavelengths are filtered by the color filters 290 and 292, respectively. The color filters 290, 292 may include a dye-based (or pigment based) polymer or resin for filtering a specific wavelength band. A micro-lens layer 295 having a plurality of micro-lenses is then formed over the color filters 290, 292 for directing and focusing light radiation towards the pixels in the device substrate 202. The lenses in the micro-lens layer 295 may be positioned in various arrangements and have various shapes depending on a refractive index of material used for the micro-lens and distance from a sensor surface. It is understood that the semiconductor device 200 may also undergo another laser annealing process before the forming of the color filters. Also, an anti-reflective-coating (ARC) layer may be optionally formed between the device substrate 202 and the color filter layer.

In summary, the methods and devices disclosed herein provide an effective and efficient approach for preventing particle contamination of the semiconductor substrate during an edge trimming process and reducing edge chipping and delamination in a semiconductor bonding process. The methods and devices disclosed herein take advantage of forming a coating layer over a device substrate prior to trimming a first edge portion of the device substrate. The coating layer is removed before bonding the device substrate to a carrier substrate. The methods and devices disclosed herein also take advantage of trimming a second edge portion of the device substrate after bonding and thinning. In doing so, the present embodiment offers several advantages over prior art devices, it being understood that different embodiments may have different advantages and that no particular advantage is necessarily required for all embodiments. One advantage of the present embodiment is that contaminant particles generated during the trimming process are deposited on the coating material and are removed along with the coating material before the bonding process, thus multiple and expensive cleaning cycles are not needed to clean the device substrate's surface before bonding, and bubble defects do not occur near a bonding interface. Another advantage of the present embodiment is that trimming the second edge portion substantially reduces the likelihood of delamination between the carrier substrate and the device substrate. Yet another advantage of the present embodiment is that no extra expensive materials are needed to perform the methods described, and the stability of the BSI process may be maintained. Furthermore, the steps outlined are compatible with a CMOS processing flow and are suitable for a VLSI (very-large-scale-integration) process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    providing a device substrate having a front side, a back side, and a first edge portion;
    forming a material layer over at least a portion of the front side of the device substrate;
    performing a first trimming process to remove at least a part of the first edge portion;
    removing the material layer;
    forming a buffer layer on the front side of the device substrate;
    bonding the front side of the device substrate to a carrier substrate, wherein the buffer layer is bonded between the device substrate and the carrier substrate;
    after the bonding, thinning the device substrate from the back side; and
    after the thinning, performing a second trimming process to remove a second edge portion of the thinned device substrate as well as a portion of the carrier substrate, wherein the second trimming process removes a portion of the buffer layer and a portion of the carrier substrate aligned with the second edge portion of the thinned device substrate.

2. The method of claim 1, wherein the semiconductor device is a back-side-illuminated image sensor.

3. The method of claim 1, further including:
    annealing the semiconductor device after the bonding;
    forming a color filter layer over the back side of the thinned device substrate; and
    forming a micro-lens layer over the color filter layer.

4. The method of claim 3, wherein the buffer layer contains a dielectric material.

5. The method of claim 1, wherein the performing the first trimming process includes removing a portion of the material layer overlying the first edge portion.

6. The method of claim 1, wherein the material layer includes one of a photoresist, tape, CVD film, PVD film, APF, wax, reusable template film, and glass.

7. The method of claim 1, wherein removing the material layer includes one of stripping, washing, UV light exposure, de-taping, and applying a mechanical force.

8. The method of claim 1, wherein the material layer is formed to substantially cover the entire front side of the device substrate.

9. A method of fabricating a semiconductor device, comprising:
    providing a device substrate having a front surface, a back surface, and an edge region;
    forming a material layer to substantially cover the front surface;
    trimming the edge region including the material layer overlying the edge region, wherein the trimming is performed from the front surface;
    removing the material layer;
    after the removing the material layer, bonding the front surface of the device substrate to a carrier substrate; and
    after the bonding, removing a portion of an edge region of the carrier substrate overlying the edge region of the device substrate, wherein the removing is performed from the back surface.

10. The method of claim 9, wherein the material layer includes one of a photoresist, tape, CVD film, PVD film, advanced patterning film, wax, reusable template film, and glass.

11. The method of claim 9, wherein removing the material layer includes one of stripping, washing, UV light exposure, de-taping, and applying a mechanical force.

12. The method of claim 9, further including thinning the device substrate from the back surface after the bonding.

13. The method of claim 9, wherein trimming the edge region includes grinding, polishing, or laser cutting.

14. The method of claim 9, wherein trimming the edge region removes only a portion of the edge region.

15. The method of claim 9, wherein trimming the edge region substantially removes the entire edge region.

16. A method of fabricating a semiconductor device, comprising:
 providing a device substrate having a front side and a back side;
 trimming an edge portion of the device substrate from the front side;
 after the trimming, bonding the front side of the device substrate to a carrier substrate, wherein the bonding the front side of the device substrate includes forming a buffer layer between the device substrate and the carrier substrate;
 after the bonding, thinning the device substrate from the back side; and
 after the thinning, trimming an edge portion of the thinned device substrate from the back side in a manner such that a portion of the carrier substrate is removed from the back side, wherein the trimming the edge portion of the thinned substrate includes removing a portion of the buffer layer.

17. The method of claim 16, the buffer layer contains a dielectric material.

18. The method of claim 17, wherein trimming the edge portion of the thinned substrate is performed in a manner such that the portion of the carrier substrate removed and the portion of the buffer layer removed are aligned with the edge portion of the thinned device substrate.

19. The method of claim 16, wherein trimming the edge portion of the thinned substrate includes one of grinding, polishing, de-taping, applying an energy beam, or selective etching.

20. The method of claim 16, wherein trimming the edge portion of the thinned substrate includes tuning a trimming depth to be around 100 um, and tuning a trimming width to be around 3200 um.

* * * * *